United States Patent
Matsumoto

(10) Patent No.: US 12,484,155 B2
(45) Date of Patent: Nov. 25, 2025

(54) PRINTED WIRING BOARD AND METHOD FOR MANUFACTURING PRINTED WIRING BOARD

(71) Applicant: KYOCERA Corporation, Kyoto (JP)

(72) Inventor: Keisaku Matsumoto, Kyoto (JP)

(73) Assignee: KYOCERA Corporation, Kyoto (JP)

(*) Notice: Subject to any disclaimer, the term of this patent is extended or adjusted under 35 U.S.C. 154(b) by 266 days.

(21) Appl. No.: 17/912,619

(22) PCT Filed: Mar. 25, 2021

(86) PCT No.: PCT/JP2021/012542
§ 371 (c)(1),
(2) Date: Sep. 19, 2022

(87) PCT Pub. No.: WO2021/200538
PCT Pub. Date: Oct. 7, 2021

(65) Prior Publication Data
US 2023/0319999 A1    Oct. 5, 2023

(30) Foreign Application Priority Data
Mar. 30, 2020   (JP) ................... 2020-059288

(51) Int. Cl.
*H05K 3/10*   (2006.01)
*H05K 1/11*   (2006.01)
*H05K 3/00*   (2006.01)

(52) U.S. Cl.
CPC ............. *H05K 3/107* (2013.01); *H05K 1/115* (2013.01); *H05K 1/11* (2013.01); *H05K 3/0038* (2013.01); *H05K 3/0047* (2013.01); *H05K 3/0055* (2013.01)

(58) Field of Classification Search
CPC ...... H05K 3/107; H05K 1/115; H05K 3/0038; H05K 3/0047; H05K 3/429; H05K 2203/0285; H05K 2203/095; H05K 3/0055

See application file for complete search history.

(56) References Cited

U.S. PATENT DOCUMENTS

| | | | |
|---|---|---|---|
| 6,831,234 B1* | 12/2004 | Asai | H01L 23/49816 |
| | | | 257/E23.174 |
| 7,390,974 B2* | 6/2008 | Shirai | H05K 3/421 |
| | | | 174/263 |
| 2011/0240358 A1* | 10/2011 | Nakai | H05K 3/108 |
| | | | 174/268 |
| 2012/0018194 A1 | 1/2012 | Maeda et al. | |

(Continued)

FOREIGN PATENT DOCUMENTS

| CN | 102413641 A | 4/2012 |
|---|---|---|
| JP | 05-235544 A | 9/1993 |

(Continued)

*Primary Examiner* — Ishwarbhai B Patel
(74) *Attorney, Agent, or Firm* — Volpe Koenig

(57) ABSTRACT

A printed wiring board includes an insulating layer and a conductor part. The insulating layer includes a cavity perpendicular to a first surface of the insulating layer. The conductor part includes a connection conductor fitted in at least part of the cavity. The cavity includes a first recess provided in an inner wall surface of the cavity. The connection conductor is partially fitted in the first recess. The first recess includes a second recess provided in an inner wall surface of the first recess. The connection conductor is partially fitted in the second recess.

14 Claims, 9 Drawing Sheets

(56) References Cited

U.S. PATENT DOCUMENTS

| | | | |
|---|---|---|---|
| 2013/0153279 A1* | 6/2013 | Hayashi | H05K 3/4673 |
| | | | 174/260 |
| 2014/0182920 A1* | 7/2014 | Yanagisawa | H05K 3/421 |
| | | | 174/262 |
| 2018/0020551 A1* | 1/2018 | Fujimura | H05K 3/007 |
| 2018/0310405 A1* | 10/2018 | Iriguchi | H05K 3/22 |

FOREIGN PATENT DOCUMENTS

| | | |
|---|---|---|
| JP | H09116265 A | 5/1997 |
| JP | 2007-158238 A | 6/2007 |
| JP | 2008-159818 A | 7/2008 |
| JP | 2017-135357 A | 8/2017 |
| WO | 2012/042846 A1 | 4/2012 |

* cited by examiner

FIG. 8

| | DESMEAR PROCESS | CONDITIONS FOR DESMEAR PROCESS | ROUGHNESS (μm) | SEM IMAGE | PEELING OF PLATING (AFTER SIX ITERATIONS OF REFLOW PROCESS AT 260C°) |
|---|---|---|---|---|---|
| COMPARATIVE EXAMPLE 1 | POTASSIUM PERMANGANATE | CONCENTRATION OF POTASSIUM PERMANGANATE: 1 N, 50 g/l | 0 | FIG. 9 | PEELING OBSERVED |
| COMPARATIVE EXAMPLE 2 | PLASMA | CONDITIONS FOR PLASMA EMISSION: [16 kW, 35 min] + [15 kW, 40 min] | 0.5 | FIG. 10 | PEELING OBSERVED |
| EXAMPLE | PLASMA + ULTRASONIC WAVES | CONDITIONS FOR PLASMA EMISSION: [16 kW, 35 min] + [15 kW, 40 min] CONDITIONS FOR ULTRASONIC EMISSION: 25 kHz, 1200 W, 30 sec | 1.0 | FIG. 4 | NO PEELING OBSERVED |

PRINTED WIRING BOARD AND METHOD FOR MANUFACTURING PRINTED WIRING BOARD

TECHNICAL FIELD

The present disclosure relates to a printed wiring board and a method for manufacturing a printed circuit board.

BACKGROUND ART

A known printed wiring board includes circuit layers isolated from each other with an insulating layer located therebetween. A known technique to form three-dimensional circuitry incorporated in a printed wiring board involves the use of vias forming an electrical connection between an outer layer circuit on a surface of the printed wiring board and an inner circuit in the printed wiring board and/or involves the use of through-holes extending through the printed wiring board to form an electrical connection between outer layer circuits on opposite sides of the printed wiring board (see, for example, Japanese Unexamined Patent Application Publication No. 2017-135357).

Such a via or through-hole, which is also referred to as a connection conductor, is obtained by forming a conductor fitted in at least part of a cavity in an insulating layer. The cavity is formed with a drill or beams of laser light. The process of providing the conductor in the cavity is preceded by a desmear process in which a smear (a resinous residue) produced at the time of forming the cavity is removed. Known methods for conducting the desmear process by which a smear is removed include chemical treatment and plasma treatment. For example, an aqueous solution of potassium permanganate is used in the chemical treatment.

SUMMARY

According to an aspect of the present disclosure, a printed wiring board includes an insulating layer and a conductor part. The insulating layer includes a cavity perpendicular to a first surface of the insulating layer. The conductor part includes a connection conductor fitted in at least part of the cavity. The cavity includes a first recess provided in an inner wall surface of the cavity. The connection conductor is partially fitted in the first recess. The first recess includes a second recess provided in an inner wall surface of the first recess. The connection conductor is partially fitted in the second recess.

According to another aspect of the present disclosure, a method for manufacturing a printed wiring board includes a cavity forming step in which a cavity perpendicular to a first surface of an insulating layer containing particles is formed. The method includes a plasma treatment step in which a smear produced in the insulating layer in the cavity forming step is removed by plasma treatment. The method includes an ultrasonication step in which a second recess is formed in an inner wall surface of a first recess in an inner wall surface of the cavity by ultrasonication after the plasma treatment step in such a manner that the particles contained in the insulating layer and exposed to view at the inner wall surface of the cavity come off the insulating layer. The method includes a connection conductor forming step in which a connection conductor is formed to be fitted in the first recess, the second recess, and at least part of the cavity.

BRIEF DESCRIPTION OF THE DRAWINGS

FIG. 8 is a table in which conditions for experiments conducted to verify the effects of Example are presented.

DESCRIPTION OF EMBODIMENTS

Embodiments will be described below with reference to the accompanying drawings. Constituent components are not drawn to scale, and the dimension ratios thereof do not fully correspond to the actual dimension ratios.

[Configuration of Printed Wiring Board]

Figure 1:
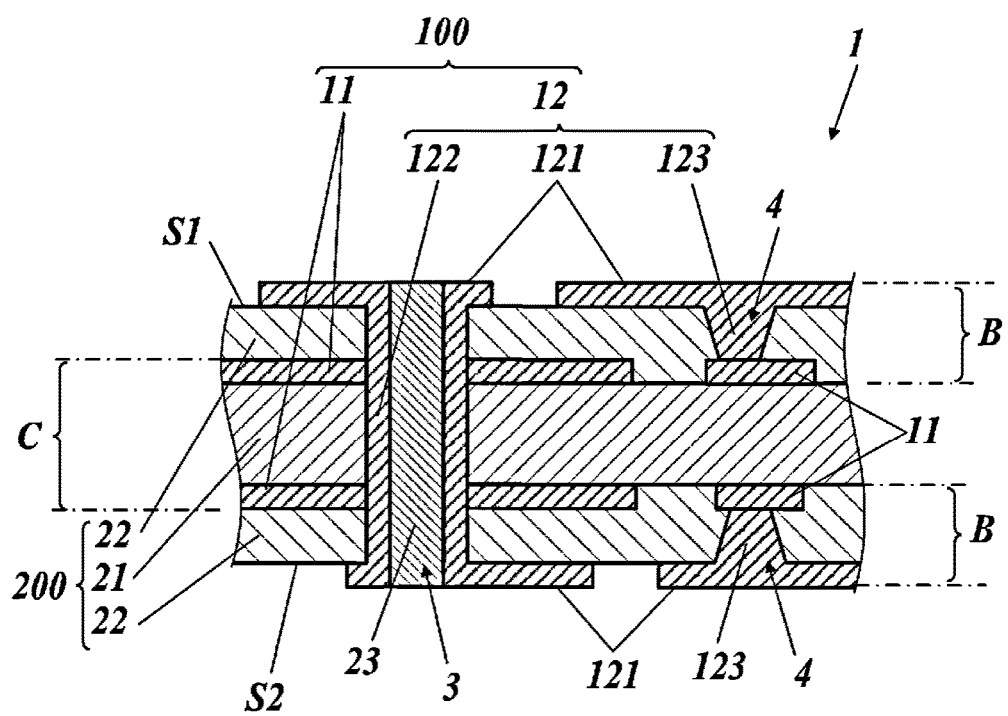
FIG. 1 is a sectional view of a printed wiring board.

Referring to FIG. 1, a printed wiring board 1 includes a conductor part 100 and an insulating layer 200. Another perspective is that the printed wiring board 1 includes a core layer C and build-up layers B, which are provided on the front and back, respectively, of the core layer C. The conductor part 100 and the insulating layer 200 are partially included in the core layer C. The conductor part 100 and the insulating layer 200 are also partially included in the build-up layers B.

The following description about the orientation of each part of the printed wiring board 1 is based on the XYZ Cartesian coordinate system, where Z denotes the thickness direction of the printed wiring board 1. The insulating layer 200 of the printed wiring board 1 has a first surface S1 and a second surface S2, which are parallel to the XY plane. The second surface S2 of the insulating layer 200 is located opposite the first surface S1 of the insulating layer 200. FIG. 1 illustrates a section perpendicular to the Y direction defined in relation to the printed wiring board 1. With regard to each of the layers constituting the printed wiring board 1, a surface oriented in the +Z direction may be hereinafter referred to as an upper surface, and a surface oriented in the −Z direction may be hereinafter referred to as a lower surface.

The core layer C includes a first insulating layer 21 and a core conductor layers 11 (an inner layer circuit). The first insulating layer 21 is in the form of a flat plate. The first insulating layer 21 may be made of any desired insulating material. For example, the first insulating layer 21 is made of organic resin, such as polyphenylene ether (PPE) resin, polyphenylene oxide resin, or cyanate ester resin, or may be made of a mixture of two or more of these.

Specific examples of the material of the first insulating layer 21 include: R-5725, R-5775, and R-5785 (manufactured by Panasonic Corporation); and DS-7409D and DS-7409DV (manufactured by Doosan Corporation).

A reinforcement material (base material) is preferably added to the organic resin that is to be used as the material of the first insulating layer 21. For example, the reinforcement material is glass fiber, nonwoven glass fabric, nonwoven aramid fabric, aramid fiber, polyester fiber, or a combination of two or more of these. The first insulating layer 21 in the present embodiment contains glass fiber (cloth).

The first insulating layer 21 also contains particles (an inorganic filler) dispersed therein. For example, the first insulating layer 21 contains particles of a substance such as aluminum hydroxide, silica, barium sulfate, talc, clay, glass, calcium carbonate, or titanium oxide. Each particle may be about 0.5 to 2 μm in diameter. The first insulating layer 21 may contain particles of a uniform diameter (size) or may have a predetermined particle size distribution.

The core conductor layers 11 are predetermined wiring patterns extending over an upper surface and a lower surface, respectively, of the first insulating layer 21. The core conductor layers 11 are made of copper or any other material.

The build-up layers B are laid on an upper surface and a lower surface, respectively, of the core layer C.

The build-up layers B include second insulating layers 22 and a conductor 12. The second insulating layers 22 are each in the form of a flat plate. The first insulating layer 21 in the core layer C and the second insulating layers 22 in the respective build-up layers B constitute the insulating layer 200. The core conductor layers 11 in the core layer C and the conductor 12 in the build-up layers B constitute the conductor part 100.

The second insulating layers 22 may be made of any desired insulating material. The first insulating layer 21 and the second insulating layers 22 may be made of the same material. For example, the second insulating layers 22 are made of polyphenylene ether (PPE) resin, polyphenylene oxide resin, cyanate ester resin, or a mixture of two or more of these. Specific examples of the material of the second insulating layers 22 include: R-5620, R-5670, R-5680 (manufactured by Panasonic Corporation); and DS-7409D and DS-7409DV (manufactured by Doosan Corporation).

A reinforcement material (base material) may be added to the organic resin that is to be used as the material of the second insulating layers 22. For example, the reinforcement material is glass fiber, nonwoven glass fabric, nonwoven aramid fabric, aramid fiber, polyester fiber, or a combination of two or more of these. As mentioned above, the first insulating layer 21 contains glass fiber (cloth). The same goes for the second insulating layers 22 in the present embodiment.

The second insulating layers 22 also contain particles (an inorganic filler) dispersed therein. The first insulating layer 21 and each of the second insulating layers 22 in the present embodiment contain particles of the same substance and within the same size range. The first insulating layer 21 and each of the second insulating layers 22 may contain particles of different materials and/or within different size ranges.

The conductor 12 includes conductor layers 121, a through-hole 122, and vias 123. The through-hole 122 and the vias 123 each may serve as a connection conductor. The conductor is made of copper or any other material.

The conductor layers 121 are laid on the first surface S1 and the second surface S2, respectively, of the insulating layer 200. Each of the conductor layers 121 is a wiring pattern and serves as a land for the through-hole 122 and the corresponding one of the vias 123. Each of the conductor layer 121 and the insulating layer 200 may be laid with copper foil provided therebetween; that is, each of the conductor layer 121 and the corresponding one of the second insulating layers 22 may be laid with copper foil provided therebetween. The copper foil is included in the conductor part 100.

The through-hole 122 is provided on an inner wall surface of a cavity 3 (a pilot through-hole), which extends through the insulating layer 200. The through-hole 122 may be filled with an insulator 23. The through-hole 122 is connected to the conductor layers 121 along the respective rims of the cavity 3 and is also connected to the core conductor layers 11 in the respective regions where the core conductor layers 11 are exposed at a surface defining the cavity 3. Thus, the conductor layer 121 on the first surface S1, the conductor layer 121 on the second surface S2, and the core conductor layers 11 are electrically connected to one another by the through-hole 122.

One of the via 123 is fitted in the entirety of a cavity 4 (a pilot via) in the second insulating layer 22. The cavity 4 extends from the first surface S1 to one of the core conductor layers 11. The via 123 is connected to the corresponding conductor layer 121 along the rim of the cavity 4 and is also connected to the corresponding core conductor layer 11 at the bottom of the cavity 4. Thus, the conductor layer 121 and the core conductor layer 11 are electrically connected to each other by the via 123. As mentioned above, the via 123 illustrated in FIG. 1 is fitted in the entirety of the cavity 4. In another example, the via 123 is provided along an inner wall surface of the cavity 4 and is fitted in part of the cavity 4. That is, a surface of the via 123 may be recessed.

The following describes the through-hole 122 in detail.

Figure 2A:
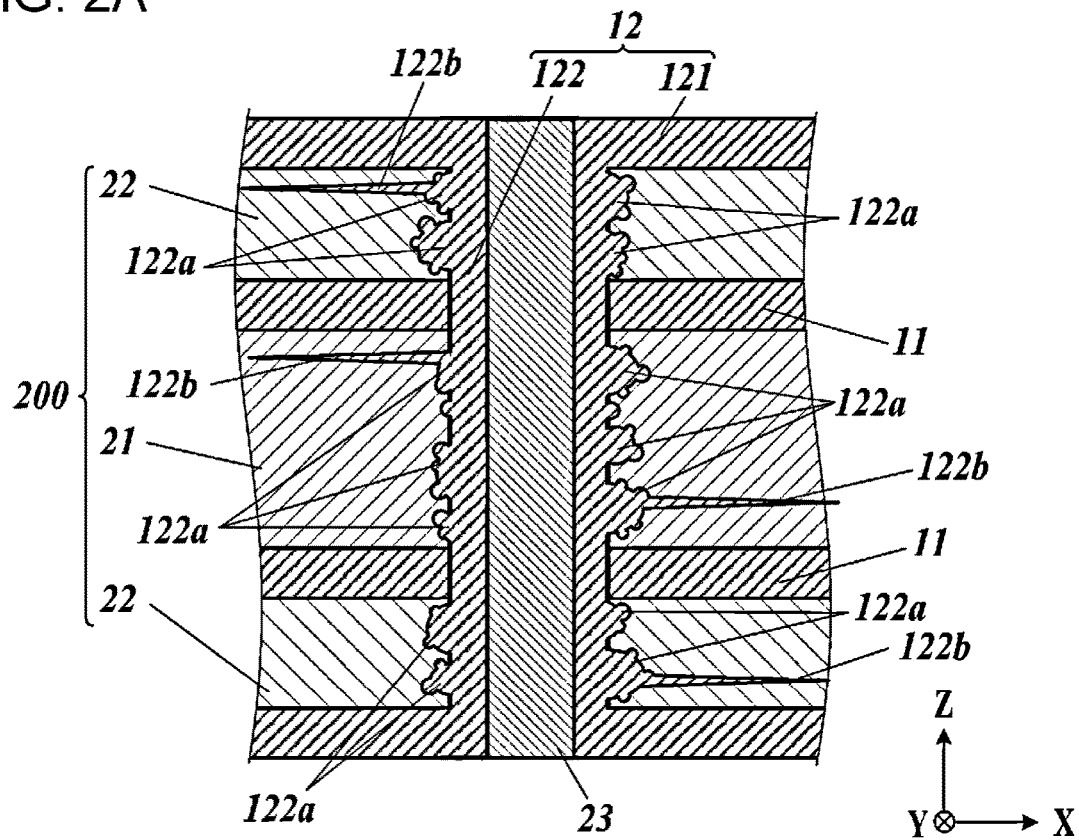
FIG. 2A is an enlarged view of a region including a through-hole in FIG. 1.
Figure 2B:
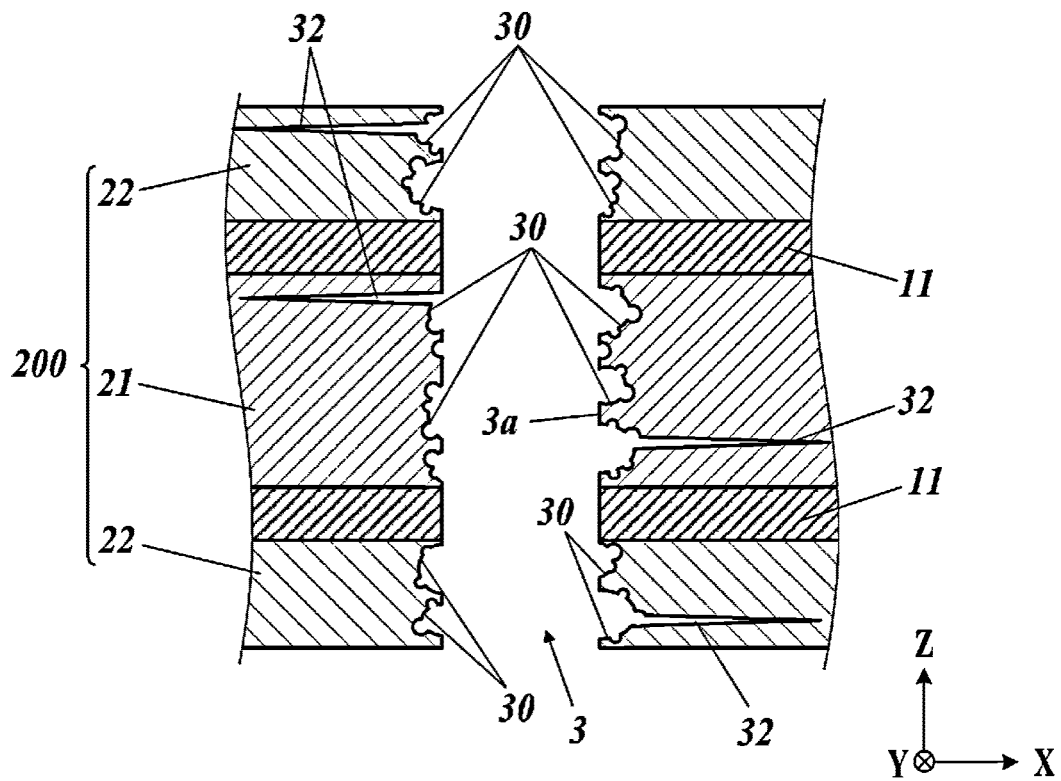
FIG. 2B is a view analogous to FIG. 2A except that the conductor is eliminated for convenience in describing the shape of the through-hole.

Referring to FIG. 2B, the inner wall surface of the cavity 3 extending through the insulating layer 200 is denoted by 3a and includes first recesses 30. The first recesses 30 are formed when the cavity 3 undergoes a desmear process, which will be described later.

Referring to FIG. 2A, the through-hole 122 includes protrusions 122a, which are fitted in the first recesses 30 in the cavity 3. In other words, each first recess 30 is fitted with the corresponding protrusion 122a, which is part of the through-hole 122. With the through-hole 122 partially extending along the inner wall surface 3a, the portion on the inner wall surface 3a and each protrusion 122a of the through-hole 122 extend without a break therebetween.

The protrusions 122a of the through-hole 122 provide enhanced adhesion between the through-hole 122 and the insulating layer 200. The enhanced adhesion reduces the possibility of cracking of the through-hole 122 and/or peeling of the plating on the through-hole 122 when the resin provided as the insulating layer 200 expands and contracts with temperature variations.

The through-hole 122 and the cavity 3 in FIGS. 2A and 2B are illustrated in such a manner that uneven spots on their surfaces (the protrusions 122a and the first recesses 30) look greater than they really are. In practical terms, part of the conductor 12 or, more specifically, the conductor layers 121 and the through-hole 122 each practically have a thickness of about 20 μm, whereas the protrusions 122a and the first recesses 30 range in size from 0.1 to several micrometers.

Referring to FIG. 2A, all of the first recesses 30 are fitted with the respective protrusions 122a. In some embodiments, some of the first recesses 30 are not fitted with the protrusions 122a.

Figure 3:
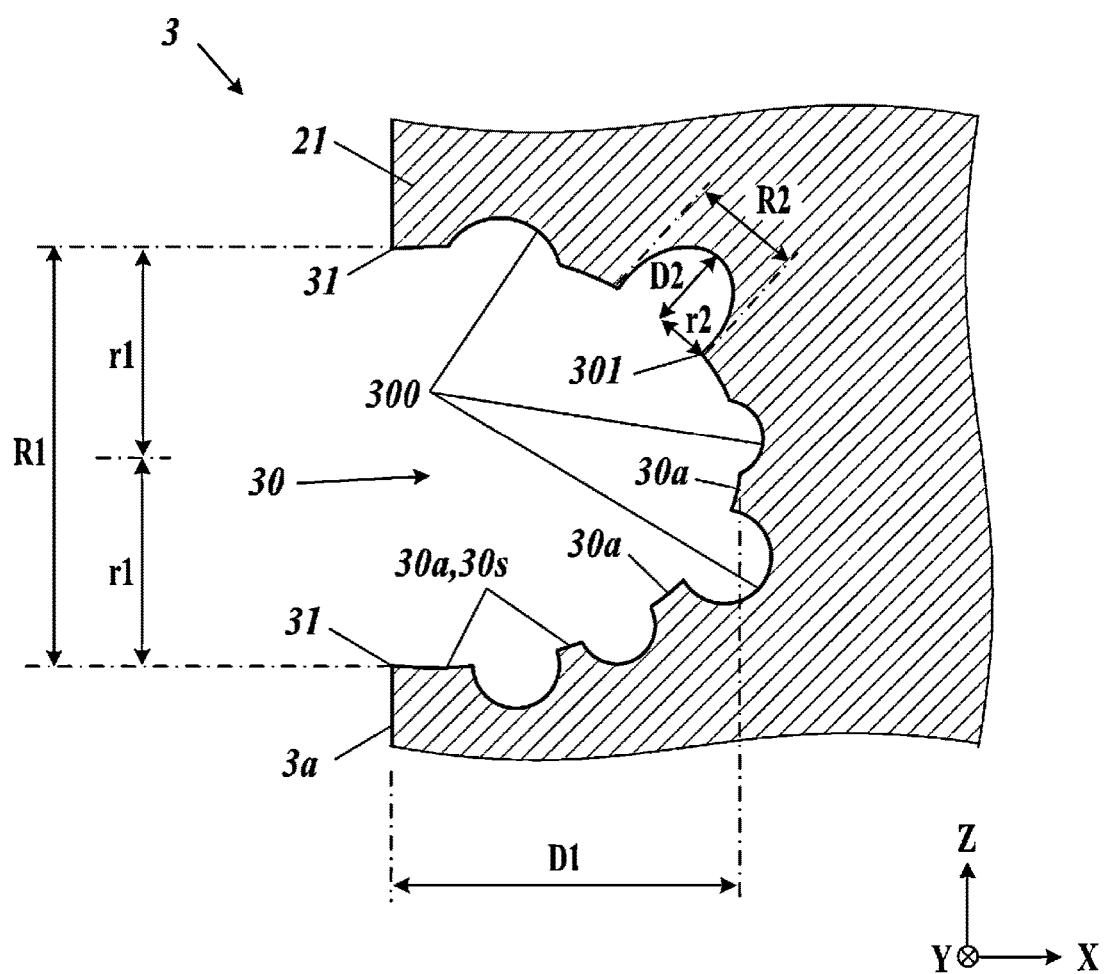
FIG. 3 is a sectional view of a first recess, illustrating the shape of the first recess.
Figure 4:
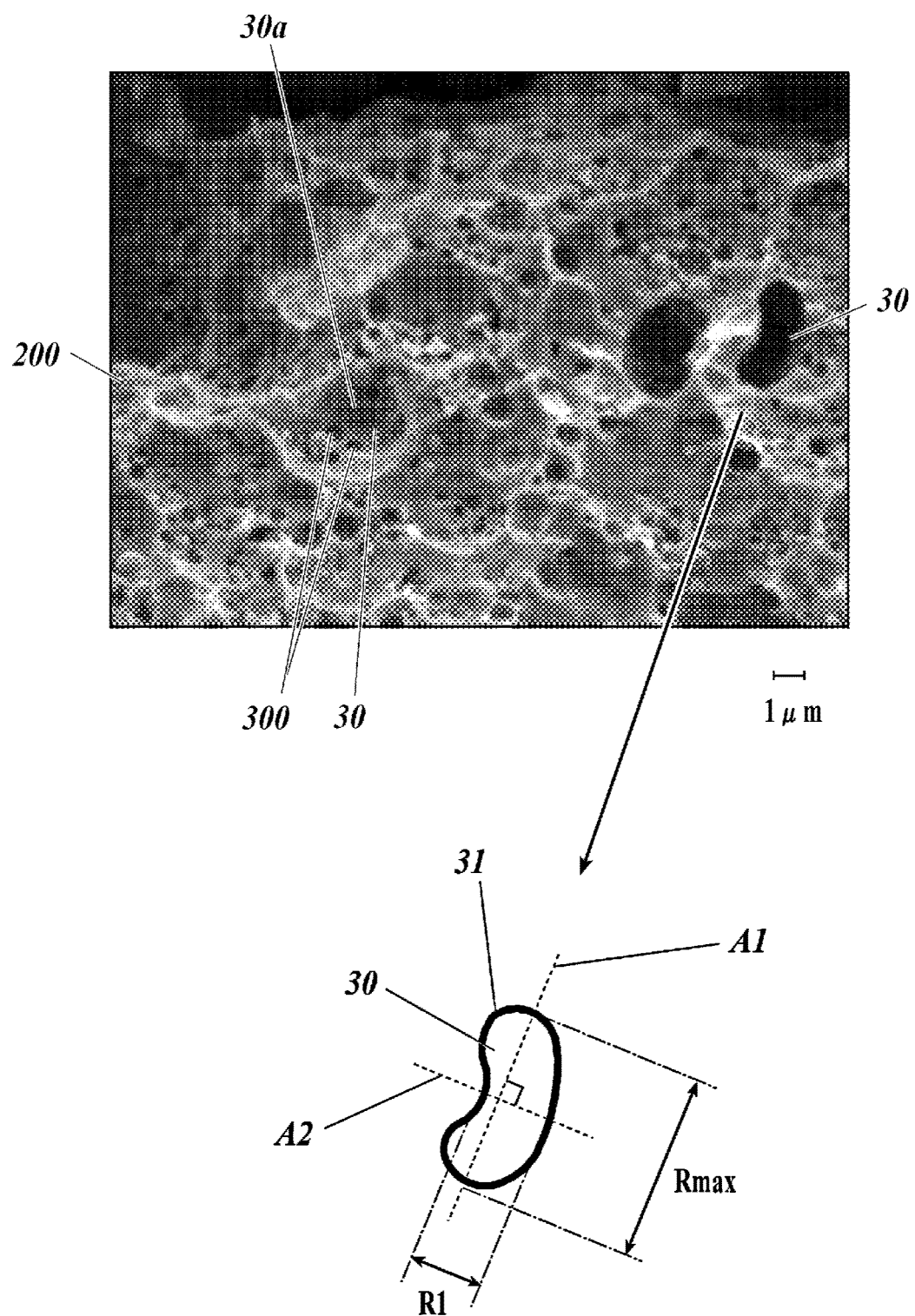
FIG. 4 is an electron micrograph of first recesses.

Referring to FIGS. 3 and 4, the first recesses 30 each have an inner wall surface 30a, in which second recesses 300 are provided. The through-hole 122 is partially located in the second recesses 300; that is, the protrusions 122a are partially located in the second recesses 300. Thus, each of the protrusions 122a is shaped in conformance with the corresponding one of the second recesses 300 and inner walls of the second recesses 300.

It is not required that all of the second recesses 300 be fitted with the respective protrusions 122a. In some embodiments, some of the first recesses 30 are not fitted with the protrusions 122a.

Particles come off the insulating layer 200 in the desmear process, which will be described later. The shape of each of the second recesses 300 is in conformity with part of the outer surface of the corresponding one of the particles. For example, particles coming off the insulating layer 200 are each in the form of a sphere, in which case the shape of the inner wall surface of each of the second recesses 300 left in the insulating layer 200 is in conformity with part of the corresponding one of the spheres. The insulating layer 200 in the present embodiment contains particles that are spherical or substantially spherical in shape. The second recesses 300 therefore each have a shape that is in conformity with part of the spherical shape or part of the substantially spherical shape. For example, the substantially spherical shape is a prolate spheroid, which is a solid generated by a half-revolution of an ellipse about its major axis. The situation in which particles come off the insulating layer 200 is herein also referred to as shedding.

Particles come off the insulating layer 200 in the desmear process such that some of the first recesses 30 each have a shape that is in conformity with part of the outer surface of the corresponding particle. What is suggested here is that some of the first recesses 30 are traces that are left behind when particles come off the insulating layer 200. In a case where plasma treatment is employed in the desmear process, the first recesses 30 may be formed by erosion.

As illustrated in FIG. 3, D1 is greater than r1, which is one half of R1. Referring to FIG. 3, D1 denotes the depth of the first recess 30, and R1 denotes the width of an opening 31 defined by the first recess 30 in the inner wall surface 3a of the cavity 3. The width R1 is the maximum width in a short transverse direction A2 of the opening 31 defined by the first recess 30 (see the lower part of FIG. 4). The short transverse direction A2 is perpendicular to a longitudinal direction A1. The width (denoted by Rmax) in the longitudinal direction A1 is the maximum width of the opening 31 defined by the first recess 30.

It is not required that the inequality D1>r1 hold for all of the first recesses 30.

As illustrated in FIG. 3, D2 is greater than r2, which is one half of R1. Referring to FIG. 3, D2 denotes the depth of at least one of the second recesses 300, and R2 denotes the width of an opening 301 defined by the second recess 300 in the inner wall surface 30a of the first recess 30. As mentioned above, the width R1 is the maximum width in the short transverse direction. Likewise, the width R2 is the maximum width in the short transverse direction of the opening 301.

It is not required that the inequality D2>r2 hold for all of the second recesses 300.

The first recess 30 includes second recesses provided in a side face 30s, which is part of the inner wall surface 30a of the first recess 30. The second recesses concerned are also denoted by 300. In other words, some of the second recesses 300 are provided in the side face 30s of the first recess 30. The side face 30s, which is part of the inner wall surface 30a, is inclined at an angle of 45° or more with respect to a plane in which the opening 31 defined by the first recess 30 is located. In some cases, not all the first recesses 30 include the second recesses 300 in their respective side faces 30s.

In the example described above with reference to FIG. 3, more than one second recess 300 is provided in the inner wall surface 30a of the first recess 30. However, the same does not necessarily hold true for all of the first recesses 30; that is, only one second recess 300 may be provided in the inner wall surface 30a. In some cases, not all the first recesses 30 include one or more second recesses 300 in their respective inner wall surfaces 30a.

Figure 5:
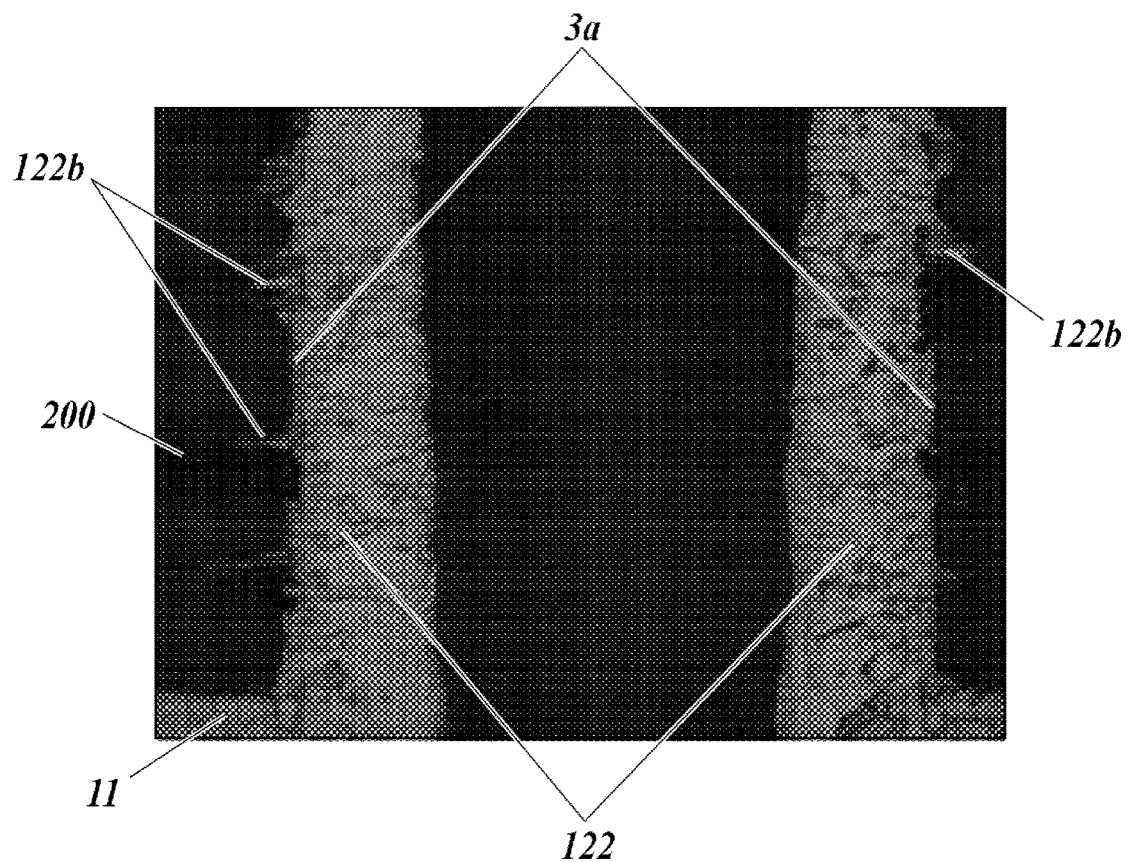
FIG. 5 is an electron micrograph of a through-hole viewed in section.

Referring to FIGS. 2A and 5, the through-hole 122 includes projections 122b, which extend in a direction that forms an angle with the inner wall surface 3a of the cavity 3. The projections 122b are each in the form of a wedge inserted into the insulating layer 200, with one end of the wedge being located on a surface of the through-hole 122 that is closer than the other surface of the through-hole 122 to the insulating layer 200, that is, with one end of the wedge being located on a surface on the inner wall surface 3a of the cavity 3. Each projection 122b is about 3 to 10 µm long. The projections 122b are herein defined as portions of the through-hole 122 that project from the inner wall surface 3a into the insulating layer 200 and are not less than 3 µm long. The glass cloth contained in the insulating layer 200 is partially damaged when the cavity 3 is formed. The affected portions, which are hereinafter referred to as damaged portions 32 (see FIG. 2B), are impregnated with a plating solution and are thus formed into the projections 122b. With the through-hole 122 partially extending along the inner wall surface 3a, the portion on the inner wall surface 3a and each projection 122b of the through-hole 122 extend without a break therebetween. The projections 122b are located at intervals of two to three layers of glass cloth, with one or more projections 122b being located in the same layer. The projections 122b further enhance the adhesion between the through-hole 122 and the insulating layer 200.

The through-hole 122 is partially located in the first recesses 30 and the second recesses 300. As illustrated in FIG. 2A, each projection 122b and the portion in the corresponding first recess 30 extend without a break therebetween, and/or each projection 122b and the portion in at least one of the second recesses 300 extend without a break therebetween.

[Method for Producing Printed Wiring Board]

The following describes a method for manufacturing the printed wiring board 1.

Figure 6A:
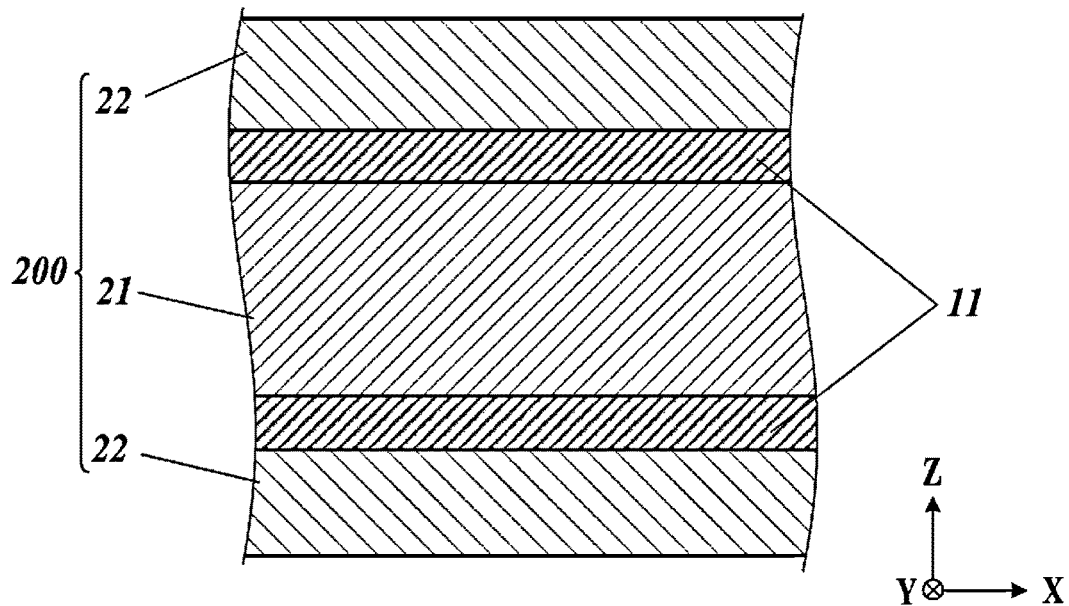
FIGS. 6A, 6B, 7A, and 7B are sectional views and illustrate a method for manufacturing a printed wiring board.

The method for manufacturing the printed wiring board 1 according to the present embodiment includes first to fourth steps. The first step involves preparation of a substrate whose surface is covered with copper foil (not illustrated). Referring to FIG. 6A, the core conductor layers 11 are formed in the insulating layer 200 to serve as an inner layer circuit.

Figure 6B:
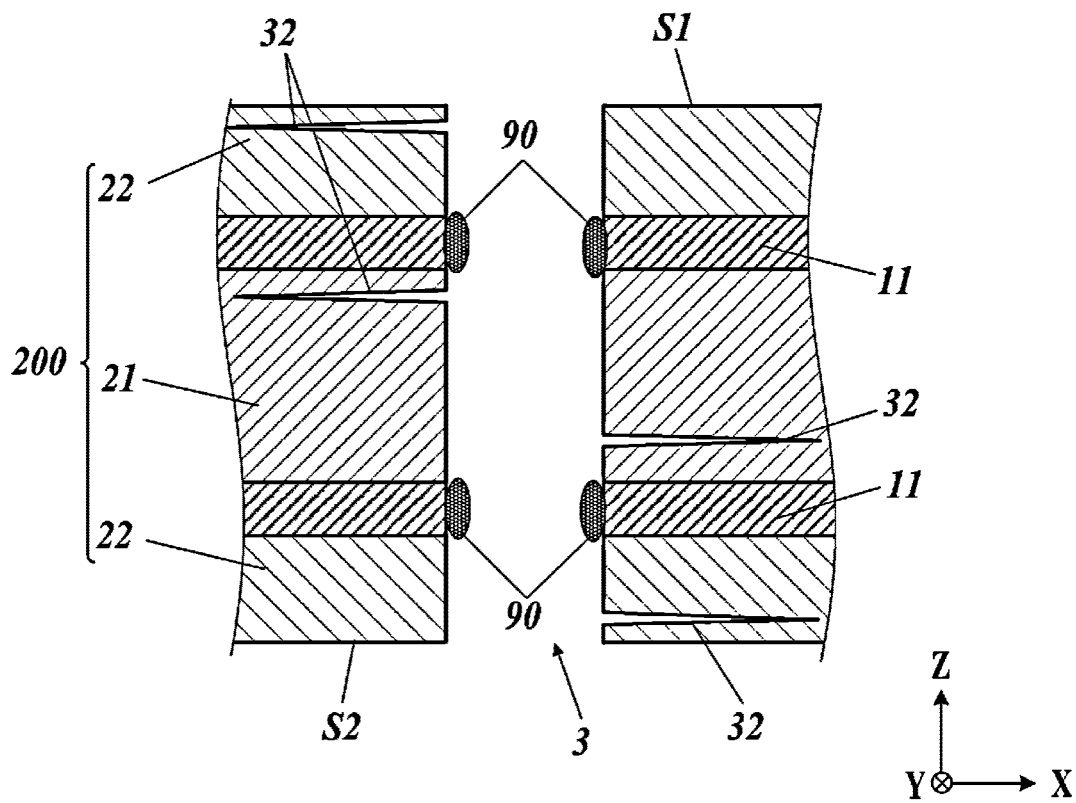

In the second step, the cavity 3 is formed. Referring to FIG. 6B, the cavity 3 is a pilot through-hole extending from the first surface S1 of the insulating layer 200 to the second surface S2 of the insulating layer 200. The second step corresponds to a cavity forming step. For example, the cavity 3 is formed with a drill in such a way that processing can be added to the first insulating layer 21 and the second insulating layers 22. Alternatively, the cavity 3 may be formed with beams of laser light.

At the completion of the second step, a smear 90 (a resinous residue) is left on the inner wall surface of the cavity 3. The smear 90 is produced at the time when the insulating layer 200 is processed. For example, the smear 90 is caused by the melting of resin subjected to heat developed during the drilling process.

The glass cloth contained in the insulating layer 200 is partially damaged in the second step. The affected portions in the insulating layer 200 are referred to as the damaged portions 32, as mentioned above.

The third step involves a desmear process by which the smear 90 left on the inner wall surface 3a of the cavity 3 is removed. In the desmear process, plasma treatment (a plasma treatment step) is applied and is followed by ultrasonication (an ultrasonication step).

Figure 7A:
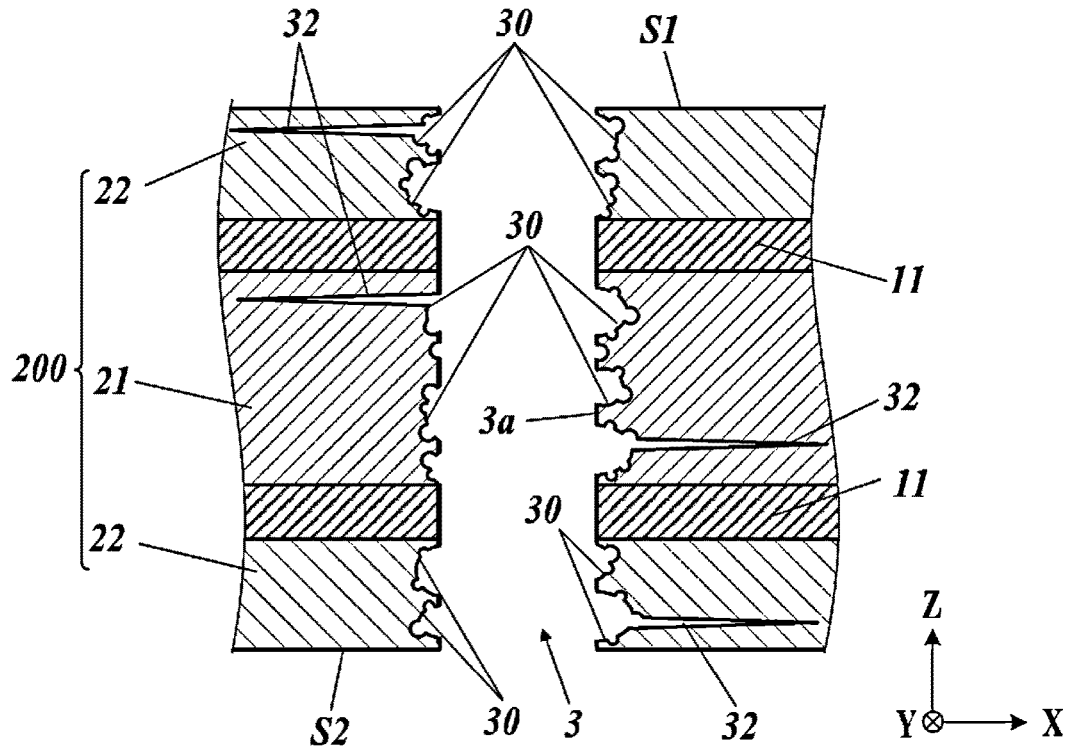

In the plasma treatment, at least one selected from the group consisting of $N_2$, $O_2$, and $CF_4$ is used as an etching gas after being converted to plasma, and the inner wall surface 3a of the cavity 3 is etched by using the copper foil on the surfaces of the insulating layer 200 as a mask. The plasma treatment is employed in such a way that the cavity 3 is exposed to plasma with an output power of 16 kW for 35 minutes and is then exposed to plasma with an output power of 15 kW for 40 minutes. Referring to FIG. 7A, the smear 90 is removed by the plasma treatment.

The plasma treatment is followed by ultrasonication, where ultrasonic waves of a predetermined intensity are emitted to water or any other liquid in which the substrate is immersed. For example, ultrasonication is applied in such a way that ultrasonic vibrations with an output power of 1200 W and a frequency of 25 kHz are created for about 30 seconds without intermission. Particles exposed to view at the inner wall surface 3a of the cavity 3 come off when subjected to ultrasonication.

The etching in the plasma treatment causes erosion of the inner wall surface 3a, and the ultrasonication causes particles to come off the inner wall surface 3a. As illustrated in FIG. 7A, the first recesses 30 are formed in the inner wall surface 3a of the cavity 3 at the time of completion of the inner wall surface treatment in the third step. The second recesses 300 are also formed in the inner wall surfaces 30a of the first recesses 30 due to losses of particles. Particles come off such that the damaged portions 32 become adjacent to the first recesses 30 and/or the second recesses 300 with no gap between each damaged portion 32 and the adjacent recess.

Figure 7B:
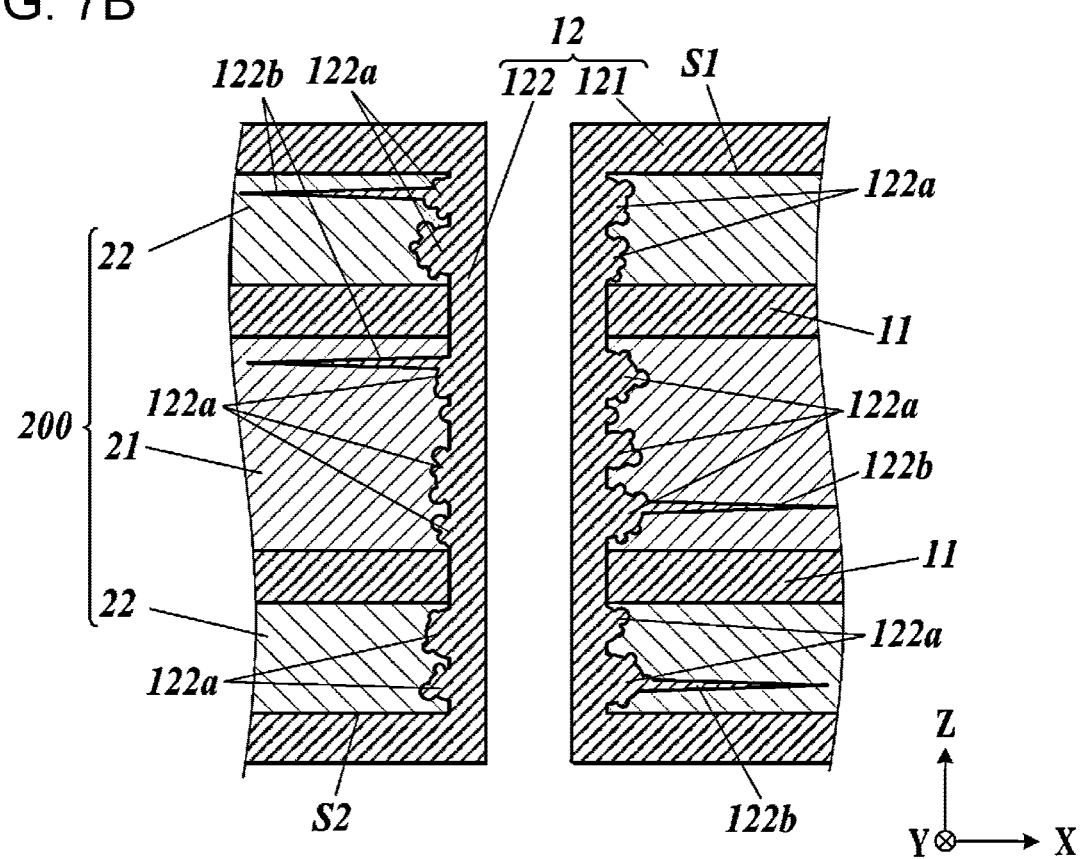

In the fourth step, the conductor 12 is formed. Referring to FIG. 7B, the conductor 12 including the conductor layers 121 and the through-hole 122 is formed by applying electrolytic panel plating to the substrate having the cavity 3 formed therein. The fourth step corresponds to a connection conductor forming step. The conductor 12 formed in the fourth step is fitted in part of the cavity 3 (i.e., in the part extending through the inner wall surface 3a) to provide the through-hole 122. The first recesses 30 and the second recesses 300 in the inner wall surface 3a of the cavity 3 are filled in with the conductor 12. The protrusions 122a are formed accordingly. The damaged portions 32 are also filled in with the conductor 12 guided through the first recesses 30 and/or the second recesses 300 such that the projections 122b are formed.

Subsequently, the conductor 12 on the first surface S1 and the second surface S2 is patterned by a subtractive process and is formed into the conductor layers 121 (see FIG. 1). The inner part of the through-hole 122 may be filled in with the insulator 23. The printed wiring board 1 is obtained by the manufacturing method that has been described so far.

In some embodiments, the conductor layers 121 are formed by a modified semi-additive process (MSAP).

Example

The following describes an example of the printed wiring board 1 according to the embodiment above.

Referring to FIG. 8, experiments were conducted to verify the effects of the example and involved desmear processes performed in different ways and/or under different conditions. In these experiments, substrates were subjected to the desmear processes after undergoing the first and second steps included in the manufacturing method mentioned above.

More specifically, the experiments are presented as Comparative Example 1, Comparative Example 2, and Example. The desmear process in Comparative Example 1 involved only chemical treatment in which an aqueous solution of potassium permanganate was used. The desmear process was performed using a 1 N (50 g/l) aqueous solution of potassium permanganate.

The desmear process in Comparative Example 2 involved plasma treatment only. $CF_4$ was used as an etching gas in the plasma treatment, in which the substrate was exposed to plasma with an output power of 16 kW for 35 minutes and was then exposed to plasma with an output power of 15 kW for 40 minutes.

The desmear process in Example involved plasma treatment followed by ultrasonication. The plasma treatment was applied using $CF_4$ as an etching gas. The substrate was exposed to plasma with an output power of 16 kW for 35 minutes and was then exposed to plasma with an output power of 15 kW for 40 minutes. The ultrasonication was applied in the following manner: ultrasonic waves were created by generating ultrasonic vibrations with an output power of 1200 W and a frequency of 25 kHz, and water in which the substrate was immersed was exposed to the ultrasonic waves for 30 seconds.

For each of Comparative Example 1, Comparative Example 2, and Example, measurements were taken to determine the roughness (arithmetic mean roughness Ra) of the inner wall surface 3a of the cavity 3 after the completion of the desmear process. The measurements obtained were as follows: (i) Ra in Comparative Example 1: 0 µm; (ii) Ra in Comparative Example 2: 0.5 µm; and (iii) Ra in Example: 1.0 µm. The inner wall surface 3a was rougher in Example than in Comparative Example 1 and Comparative Example 2. This was due to the fact that particles came off the inner wall surface 3a in Example.

For each of Comparative Example 1, Comparative Example 2, and Example, the inner wall surface 3a of the cavity 3 was photographed using a scanning electron microscope (SEM) after the completion of the desmear process.

Figure 9:
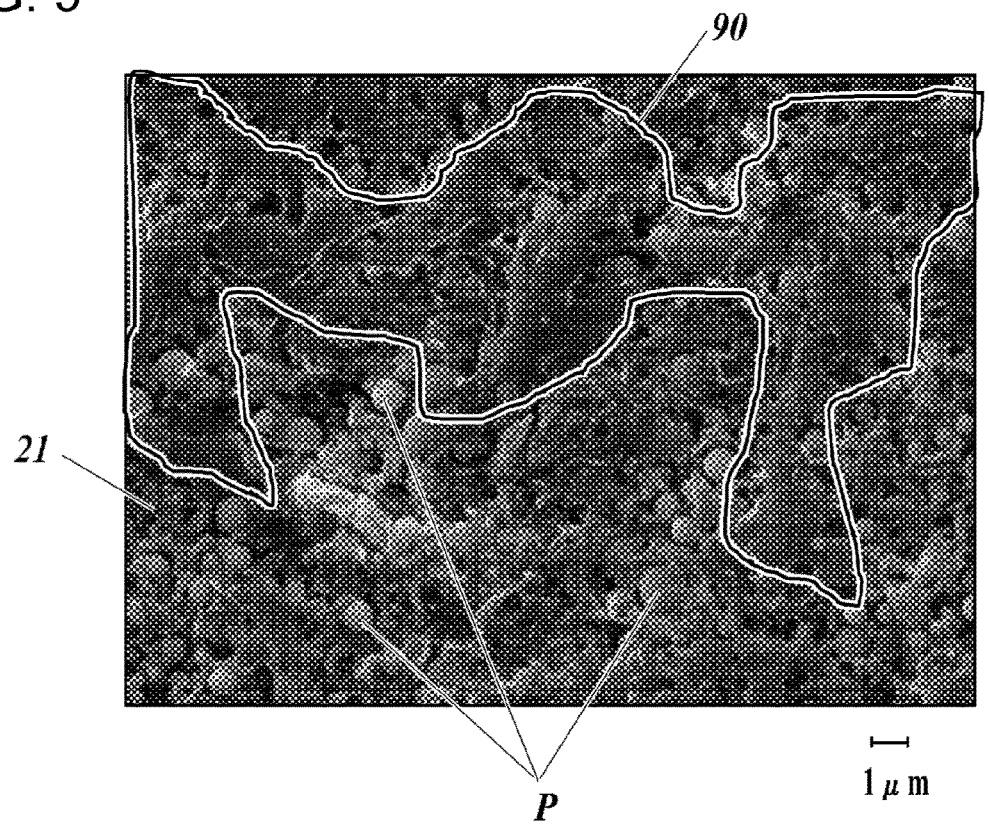
FIG. 9 is an electron micrograph of an inner wall surface in Comparative Example 1.

As can be seen in FIG. 9, particles P were exposed at the inner wall surface 3a in Comparative Example 1. The experiment in which an aqueous solution of potassium permanganate was used in the desmear process revealed that particles P in the resin provided as the insulating layer 200 did not come off and remained buried in the insulating layer 200, which thus did not have recesses (traces of particles).

The smear 90 was observed on the inner wall surface 3a. The desmear process in which an aqueous solution of potassium permanganate was used presumably produced little effect in removing a smear from the insulating layer 200 made mainly of a low dielectric constant material such as polyphenylene ether resin, polyphenylene oxide resin, or cyanate ester resin.

Figure 10:
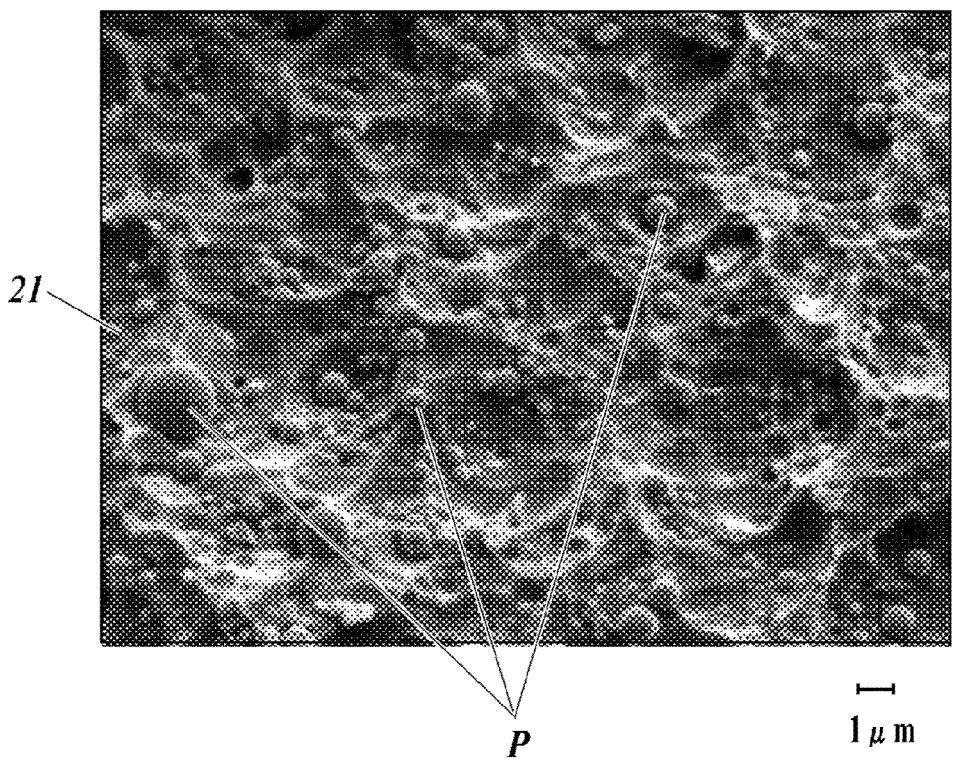
FIG. 10 is an electron micrograph of an inner wall surface in Comparative Example 2.

As can be seen in FIG. 10, the smear 90 was not observed on the inner wall surface 3a in Comparative Example 2. The experiment revealed that the plasma treatment effectively removed the smear 90.

Unfortunately, the particles P were exposed at the inner wall surface 3a in Comparative Example 2. The experiment in which the desmear process involved only the plasma treatment revealed that particles P in the resin provided as the insulating layer 200 did not come off and remained buried in the insulating layer 200, which thus did not have recesses (traces of particles).

An electron micrograph of the inner wall surface 3a in Example is presented in FIG. 4. As can be seen in FIG. 4, the first recesses 30 each including the second recesses 300 were formed in the inner wall surface 3a due to losses of the particles P. Example in which the first recesses 30 and the second recesses 300 were formed in the inner wall surface 3a of the cavity 3 revealed that the inner wall surface 3a was successfully roughened by the ultrasonication following the plasma treatment.

Following the completion of the desmear processes, Comparative Example 1, Comparative Example 2, and Example were each subjected to a heating test, after which the conductor 12 (the through-hole 122) on the inner wall surface 3a was inspected for signs of peeling (see the rightmost column in FIG. 8). The substrates subjected to the heating test underwent six iterations of the reflow process (intended as a simulation for actual component mounting), in which each substrate was heated to 260° C.

After the completion of the heating test, signs of peeling of the conductor 12 were observed in Comparative Example 1 and Comparative Example 2, whereas no sign of peeling of the conductor 12 was observed in Example (see FIG. 8). The experiments revealed that enhanced adhesion between the conductor 12 and the insulating layer 200 was provided in Example, in which the first recesses 30 and the second recesses 300 were formed in the inner wall surface 3a of the cavity 3; that is, the inner wall surface 3a of the cavity 3 was roughened, which was due to shedding of particles with poor plating adhesion.

[Effects]

The printed wiring board 1 according to the present embodiment includes the insulating layer 200 and the conductor part 100. The insulating layer 200 includes the cavity 3 perpendicular to the first surface S1 of the insulating layer 200. The conductor part 100 includes the through-hole 122. The through-hole 122 is a connection conductor fitted in at least part of the cavity 3. The cavity 3 includes the first recess 30. The first recess 30 is provided in the inner wall surface 3a of the cavity 3. The through-hole 122 is partially fitted in the first recess 30. The first recess 30 includes the second recess 300. The second recess 300 is provided in the inner wall surface 30a of the first recess 30. The through-hole 122 is partially fitted in the second recess 300.

The smear 90 produced at the time when the insulating layer 200 was processed may be removed by a known method, such as chemical treatment in which an aqueous solution of potassium permanganate solution is used. Unfortunately, the desmear process in which an aqueous solution of potassium permanganate is used produces little effect in removing the smear 90 from the insulating layer 200 made mainly of a low dielectric constant material such as polyphenylene ether resin, polyphenylene oxide resin, or cyanate ester resin. This has been described above in relation to Comparative Example 1 with reference to FIG. 8. The smear 90 is likely to cause faulty connection between the through-hole 122 and the core conductor layers 11.

The possibility of faulty connection may be addressed by the plasma treatment. The smear 90 can be removed more effectively by the plasma treatment than would be possible by the chemical treatment in which an aqueous solution of potassium permanganate is used. Because of the nature of the plasma treatment, the inner wall surface 3a of the cavity 3 subjected to the plasma treatment tends to be less rough; that is, the inner wall surface 3a tends to have a small number of protrusions and recesses, and/or irregularities in the inner wall surface 3a tend to be less deep. Particles exposed at the inner wall surface 3a are hardly covered by plating. The resultant poor adhesion between the inner wall surface 3a of the cavity 3 and the through-hole 122 (the conductor 12) makes it difficult to attain thermal reliability. This can be understood from Comparative Example 2 (see FIG. 8). More specifically, the insulating layer expands and contracts with temperature variations when undergoing, for example, a reflow process. As the insulating layer 200 expands and contracts perpendicularly to the first surface S1, cracks can be developed in the through-hole 122, and/or the through-hole 122 can partially come off the inner wall surface 3a.

In the present embodiment, the first recess 30 including the second recesses 300 is formed in the inner wall surface 3a of the cavity 3 and adds an extra surface area to the inner wall surface 3a. In this respect, the present embodiment has an advantage over the known art. The increased area of contact between the through-hole 122 (the conductor 12) and the inner wall surface 3a of the cavity 3 provides enhanced adhesion between the through-hole 122 and the inner wall surface 3a. The through-hole 122 can thus resist cracking and peeling when the insulating layer 200 expands and contracts with temperature variations. A high degree of thermal reliability is achieved accordingly.

Thus, the surface of the through-hole 122 (the surface closer to the cavity 3) is endowed with a suitable degree of roughness. The improvement obtained by the present embodiment is analogous to the development made in copper foil known as STD (standard copper foil). For example, RTF (reverse treated foil) is an advanced type of copper foil, and HVLP (hyper very low profile copper foil) is a further advanced type of copper foil. The adhesion between the through-hole 122 and the insulating layer 200 is increased without degradation in radio-frequency signal transmission characteristics.

The first recess 30 includes the second recesses 300 provided in the inner wall surface 30a of the first recess 30. The resultant increase in the inner wall surface 3a of the cavity 3 provides further enhanced adhesion between the through-hole 122 and the inner wall surface 3a of the cavity 3.

The depth D1 of at least one of the first recesses 30 is greater than the width r1, which is one half of the width R1 in the short transverse direction of the opening 31 defined by the first recess 30 in the inner wall surface 3a of the cavity 3. This feature yields an increase in the area of contact between the through-hole 122 and the inner wall surface of the first recess 30, and the protrusions 122a of the through-hole 122 are less likely to slip out of the first recess 30. The adhesion between the through-hole 122 and the inner wall surface 3a of the cavity 3 is further enhanced accordingly.

The depth D2 of at least one of the second recesses 300 is greater than the width r2, which is one half of the width R2 in the short transverse direction of the opening 31 defined by the second recess 300 in the inner wall surface 30a of the first recess 30. This feature yields an increase in the area of contact between the through-hole 122 and the inner wall surface of the second recess 300, and portions of the through-hole 122 (each protrusion 122a) that are located within the second recess 300 are less likely to slip out of the second recess 300. The adhesion between the through-hole 122 and the inner wall surface 3a of the cavity 3 is further enhanced accordingly.

The first recess 30 includes the second recess 300 provided in the side face 30s, which is part of the inner wall surface 30a of the first recess 30. In the second recess 300 provided in the side face 30s, the protrusion 122a extends in a direction that forms an angle with the depth direction of the first recess 30. The portion in the second recess 300 provided in the side face 30s is hereinafter referred to as a side face filler portion. When a force is exerted in such a way as to withdraw the protrusion 122a from the first recess 30 in its depth direction, the side face filler portion of the protrusion 122a is caught in the inner wall surface of the second recess 300 such that the protrusion 122a is hindered from slipping out of the first recess 30. The adhesion between the through-hole 122 and the inner wall surface 3a of the cavity 3 is further enhanced accordingly.

The insulating layer 200 contains particles. The second recess 300 has a shape that is in conformity with part of the outer surface of the corresponding one of the particles shed from the insulating layer 200. What is suggested here is that the second recess 300 is one of the traces that are left behind when the particles come off the insulating layer 200. The ultrasonication by which the particles come off the insulating layer 200 is simple and is all that is required to form the second recess 300.

The insulating layer 200 contains particles. The first recess 30 has a shape that is in conformity with part of the outer surface of the corresponding one of the particles shed from the insulating layer 200. What is suggested here is that the first recess 30 is one of the traces that are left behind when the particles come off the insulating layer 200. The ultrasonication by which the particles come off the insulating layer 200 is simple and is all that is required to form the first recess 30.

The through-hole 122 includes the projections 122b, which extend in the direction that forms an angle with the inner wall surface 3a of the cavity 3. The adhesion between the through-hole 122 and the inner wall surface 3a of the cavity 3 is further enhanced accordingly.

With the through-hole 122 including a portion located in the first recess 30 and a portion located in the second recess 300, the portion in the first recess 30 and the projection 122b extend without a break therebetween, and/or the portion in the second recess 300 and the projection 122b extend without a break therebetween. Another perspective is that the damaged portions 32, which are located in the glass cloth and are to become the projections 122b, are provided in such a manner as to meet the cavity 3 when particles exposed to view at the inner wall surface 3a of the cavity 3 come off. Thus, the damaged portions 32 are easily impregnated with a plating solution after the particles come off the inner wall surface 3a. The conductor 12 (the through-hole 122) including a larger number of projections 122b is formed accordingly.

The connection conductor is the through-hole 122, which extends through the printed wiring board 1. The conductor layers 121 on both sides of the insulating layer 200 are thus electrically connected to the core conductor layers 11 in the insulating layer 200. The adhesion between the through-hole 122 and the inner wall surface 3a of the cavity 3 is enhanced by the first recess 30 and the second recess 300, leading to increased reliability of the connection.

The insulating layer 200 contains at least one selected from the group consisting of polyphenylene ether resin, polyphenylene oxide resin, and cyanate ester resin. This composition makes it difficult to remove the smear 90 from the insulating layer 200 with an aqueous solution of potassium permanganate. As a workaround, the embodiment above involves the desmear process including both the plasma treatment and the ultrasonication. The desmear process in the embodiment enables removal of the smear 90 and increases the adhesion between the through-hole 122 and the inner wall surface 3a of the cavity 3.

The method for manufacturing the printed wiring board 1 according to the present embodiment includes the cavity forming step, the plasma treatment step, the ultrasonication step, and a connection conductor forming step. In the cavity forming step, the cavity 3 perpendicular to the first surface S1 of the insulating layer 200 containing particles is formed. In the plasma treatment step, the smear 90 produced in the insulating layer 200 in the cavity forming step is removed by plasma treatment. In the ultrasonication step, the second recess 300 is formed in the inner wall surface 30a of the first recess 30 in the inner wall surface 3a of the cavity 3 by ultrasonication after the plasma treatment step in such a manner that the particles contained in the insulating layer 200 and exposed to view at the inner wall surface 3a of the cavity 3 come off the insulating layer 200. In the connection conductor forming step, the through-hole 122 is formed to be fitted in the first recess 30, the second recess 300, and at least part of the cavity 3. The method, by which the first recess 30 including the second recess 300 provided in the inner wall surface 3a of the cavity 3, adds an extra surface area to the inner wall surface 3a. In this respect, the method has an advantage over the known art. The increased area of contact between the through-hole 122 (the conductor 12) and the inner wall surface 3a of the cavity 3 and the shedding of particles with poor plating adhesion provide enhanced adhesion between the through-hole 122 and the inner wall surface 3a. The through-hole 122 can thus resist cracking and peeling when the insulating layer 200 expands and contracts with temperature variations. A high degree of thermal reliability is achieved accordingly.

The smear 90 is effectively removed by the plasma treatment in which at least one selected from the group consisting of $N_2$ gas, $O_2$ gas, and $CF_4$ gas is used.

The embodiment above is presented as an example, and various changes may be made to the embodiment.

The first recess 30 and the second recess 300 in the embodiment above are formed in the inner wall surface 3a of the cavity 3 (a pilot through-hole) on which the through-hole 122 (the connection conductor) is provided. In some embodiments, the first recess 30 and the second recess 300 are formed in the inner wall surface of the cavity 4 (a pilot blind via) of each via 123 (the connection conductor).

The conditions for the plasma treatment and the conditions for the ultrasonication in the embodiment above are presented as examples and may be adjusted as appropriate depending on, for example, the material and size of the insulating layer 200 and the material and size of the particles contained in the insulating layer 200.

The printed wiring board 1 in the embodiment above includes the through-hole 122 and the via 123. In some embodiments, the printed wiring board 1 includes the through-hole 122 or the via 123 only.

Two or more build-up layers B may be laid on each surface of the core layer C. The build-up layers B are optional. That is, the printed wiring board 1 may be essentially the core layer C.

The core layer C may include two or more first insulating layers 21. The build-up layers B each may include two or more second insulating layers 22. Only one surface of the core layer C may be overlaid with the build-up layer B.

The printed wiring board 1 may include only one conductor layer 121 located on one surface of the printed wiring board 1.

The details (e.g., features, structures, positional relationships, and shapes) described above in relation to the embodiment may be changed as appropriate within a range not departing from the spirit of the disclosure. The features, structures, positional relationships, and shapes described above in relation to the embodiment may be employed in combination as appropriate within a range not departing from the spirit of the disclosure.

INDUSTRIAL APPLICABILITY

The present disclosure is applicable to a printed wiring board and a method for manufacturing a printed circuit board.

REFERENCE SIGNS 1 printed wiring board
3, 4 cavity
3a inner wall surface
100 conductor part
11 core conductor layer
12 conductor
121 conductor layer
122 through-hole (connection conductor)
122a protrusion
122b projection
123 via (connection conductor)
200 insulating layer
21 first insulating layer
22 second insulating layer
23 insulator
30 first recess
30a inner wall surface
30s side face
31 opening
32 damaged portion
300 second recess
301 opening
90 smear
A1 longitudinal direction
A2 short transverse direction
B build-up layer
C core layer
P particle

The invention claimed is:

1. A printed wiring board comprising:
an insulating layer including
a first surface,
an impregnating material made of an organic resin,
a plurality of particles dispersed in the impregnating material, and
a cavity perpendicular to the first surface, the cavity comprising a first recess in an inner wall surface of the cavity, the first recess comprising a second recess in an inner wall surface of the first recess; and
a conductor part including a connection conductor fitted in at least part of the cavity, wherein the connection conductor is partially fitted in the first recess and partially fitted in the second recess and further includes a plurality of wedge-shaped projections that:
(i) are integrally continuous with a portion of the connection conductor located in the first recess and or the second recess, and
(ii) are disposed along a thickness direction of the insulating layer at intervals corresponding to two to three reinforcement-cloth layers.

2. The printed wiring board according to claim 1, wherein the second recess comprises a plurality of second recesses in the inner wall surface of the first recess.

3. The printed wiring board according to claim 1, wherein a depth of the first recess is greater than one half of a width in a short transverse direction of an opening defined by the first recess in the inner wall surface of the cavity.

4. The printed wiring board according to claim 1, wherein a depth of the second recess is greater than one half of a width in a short transverse direction of an opening defined by the second recess in the inner wall surface of the first recess.

5. The printed wiring board according to claim 1, wherein the second recess is in a side face, the side face being part of the inner wall surface of the first recess.

6. The printed wiring board according to claim 1, wherein
the insulating layer contains particles, and
the second recess has a shape being in conformity with part of an outer surface of a corresponding particle shed from the insulating layer.

7. The printed wiring board according to claim 1, wherein
the insulating layer contains particles, and
the first recess has a shape being in conformity with part of an outer surface of a corresponding particle shed from the insulating layer.

8. The printed wiring board according to claim 1, wherein the connection conductor includes a projection extending in a direction forming an angle with the inner wall surface of the cavity.

9. The printed wiring board according to claim 8, wherein the portion in the first recess and the projection extends without a break therebetween, and/or the portion in the second recess and the projection extends without a break therebetween.

10. The printed wiring board according to claim 1, wherein the connection conductor is a through-hole extending through the printed wiring board.

11. The printed wiring board according to claim 1, wherein the insulating layer contains at least one selected from the group consisting of polyphenylene ether resin, polyphenylene oxide resin, and cyanate ester resin.

12. The printed wiring board of claim 1, wherein the plurality of wedge-shaped projections have a length of 3 μm to 10 μm.

13. A method for manufacturing a printed wiring board, the method comprising:
forming a cavity perpendicular to a first surface of an insulating layer containing particles;
removing a smear produced in the insulating layer in the cavity forming step by plasma treatment;
forming a second recess in an inner wall surface of a first recess on a surface of an impregnating material in an inner wall surface of the cavity by ultrasonication after the plasma treatment in such a manner that the particles contained in the insulating layer and exposed to view at the inner wall surface of the cavity come off the insulating layer; and
forming a connection conductor to be fitted in the first recess, the second recess, and at least part of the cavity,
forming a plurality of wedge-shaped projections in the connection conductor, wherein plurality of wedge-shaped projections:

(i) are integrally continuous with a portion of the connection conductor located in the first recess and/or the second recess, and (ii) are disposed along a thickness direction of the insulating layer at intervals corresponding to two to three reinforcement-cloth layers, and wherein the impregnating material is made of an organic resin and a plurality of particles are dispersed in the impregnating material.

14. The method according to claim 13, wherein the plasma treatment is conducted by using at least one selected from the group consisting of $N_2$ gas, $O_2$ gas, and $CF_4$ gas.

* * * * *